(12) United States Patent
Oshinowo

(10) Patent No.: US 6,189,552 B1  
(45) Date of Patent: Feb. 20, 2001

(54) SUBSTRATE PROCESSING DEVICE

(75) Inventor: John Oshinowo, Schlaitdorf (DE)

(73) Assignee: STEAG MicroTech GmbH (DE)

(*) Notice: Under 35 U.S.C. 154(b), the term of this patent shall be extended for 0 days.

(21) Appl. No.: 09/308,850

(22) PCT Filed: Oct. 1, 1997

(86) PCT No.: PCT/EP97/05409

§ 371 Date: May 24, 1999

§ 102(e) Date: May 24, 1999

(87) PCT Pub. No.: WO98/24114

PCT Pub. Date: Jun. 4, 1998

(30) Foreign Application Priority Data

Nov. 22, 1996 (DE) .............................................. 196 48 498

(51) Int. Cl.[7] .............................. B08B 3/12; B08B 13/00
(52) U.S. Cl. ......................... 134/201; 134/184; 134/902
(58) Field of Search .................................... 134/402, 201, 134/182, 184, 186; 118/500

(56) References Cited

U.S. PATENT DOCUMENTS

| | | |
|---|---|---|
| 5,383,484 | 1/1995 | Thomas et al. |
| 5,584,401 * | 12/1996 | Yoshida ..................... 134/902 X |
| 5,873,947 * | 2/1999 | Mohindra et al. ............. 134/902 X |
| 5,996,601 * | 12/1999 | Kern, Jr. et al. .............. 134/902 X |

FOREIGN PATENT DOCUMENTS

| | | |
|---|---|---|
| 35 27 515 A1 | 2/1986 | (DE) . |
| 37 12 064 A1 | 10/1988 | (DE) . |
| 39 30 056 A1 | 3/1990 | (DE) . |
| 44 13 077 C2 | 10/1995 | (DE) . |
| 195 46 990 C2 | 7/1996 | (DE) . |
| 196 16 402 A1 | 11/1997 | (DE) . |
| 196 37 875 | 11/1997 | (DE) . |
| 196 44 253 A1 | 5/1998 | (DE) . |
| 6204197 | 7/1994 | (JP) . |
| 06283486 | 10/1994 | (JP) . |
| 95 02473 | 1/1995 | (WO) . |

* cited by examiner

Primary Examiner—Philip R. Coe  
(74) Attorney, Agent, or Firm—Robert W. Becker & Associates

(57) ABSTRACT

An apparatus for processing substrates is provided. The apparatus includes a receptacle for containing processing fluid, and at least one substrate support. Components of the receptacle and/or substrate support that come into contact with processing fluid have a protective layer. Guide or support members for the substrates are fused to the protective layer.

19 Claims, 3 Drawing Sheets

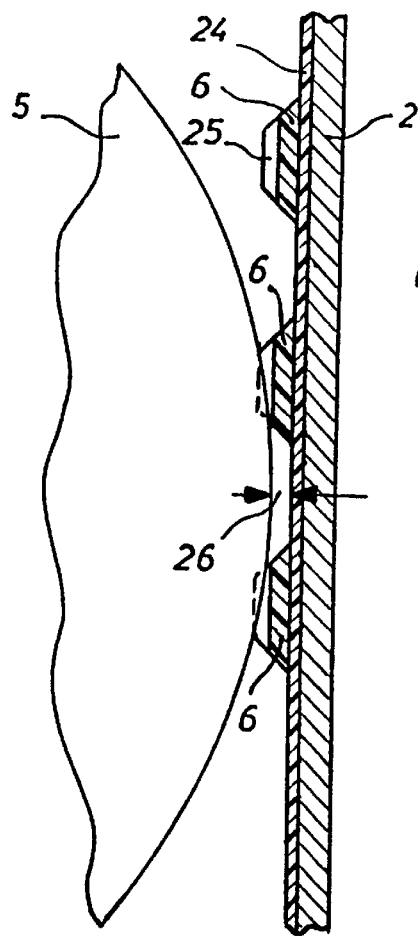
Fig. 2
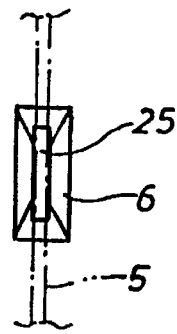
Fig. 5
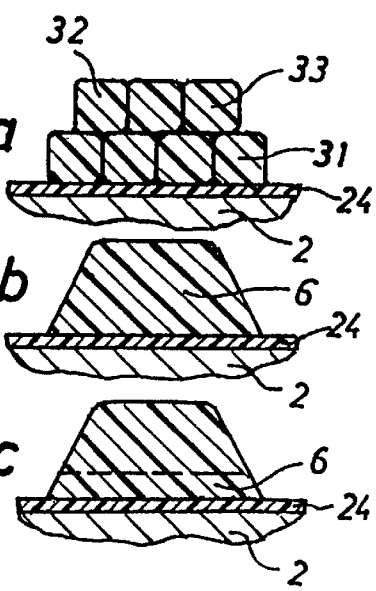
Fig. 3a
Fig. 3b
Fig. 3c
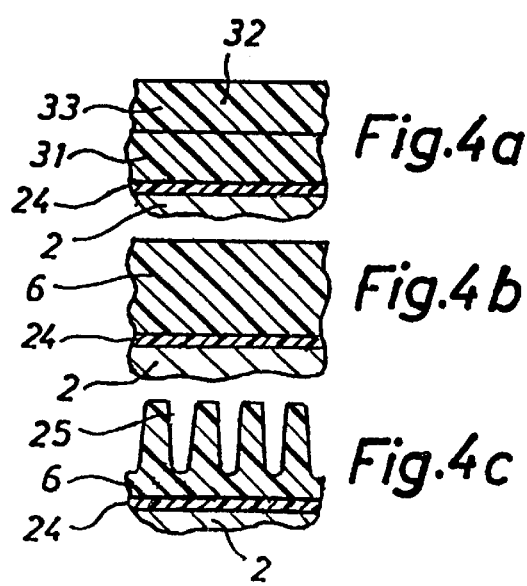
Fig. 4a
Fig. 4b
Fig. 4c

SUBSTRATE PROCESSING DEVICE

BACKGROUND OF THE INVENTION

The present invention relates to an apparatus for processing substrates, and includes a receptacle containing a processing fluid and at least one substrate support, whereby the components of the receptacle and/or of the substrate support that come into contact with the processing fluid have a protective layer, and whereby guide and/or support elements for the substrates are fused onto the protective layer.

An apparatus of this type is known from WO 95/02473 A1.

Further apparatus for processing substrates, especially semiconductor wafers, are known from the publications DE 44 13 077 A1, and DE 195 46 990 A1 of the present applicant, and are furthermore described in the not yet published German Patent applications DE 196 16 402.8, DE 196 15 969.5, DE 196 37 875.3, DE 196 44 253.2 and DE 196 44 254.0. Receptacles or substrate supports made of metal, for example stainless steel, are coated with a protective layer that not only protects the receptacle wall and the substrate supports from corrosive processing fluid, but also prevents the processing fluid from being contaminated by metallic parts.

JP 6-28 34 86 A2 or DE 39 30 056 A1 disclose wafer cassettes or wafer baskets for transporting and supporting wafers, with guide and support elements being provided that have a shape or are rounded in order during introduction and removal of the wafers to avoid damage thereto. The publications JP 4-130 724 A1 and JP 6-204 197 A2 show wafer cleaning apparatus where the processing receptacle or the wafer support is made of quartz.

It is an object of the present invention to provide an apparatus for processing substrates that in particular with regard to the guide and support elements for the substrates in the receptacle is optimally configured and can be economically manufactured, and in addition has a long service life.

SUMMARY OF THE INVENTION

The stated objective is inventively realized in that the guide elements are formed of polymeric strands that are fused with the protective layer and with one another.

As a consequence of the inventive measure of fusing onto the protective layer guide and/or support elements for the substrates in the form of strands, the manufacture of such apparatus is particularly simple and economical. It is now also possible to choose receptacles of metal that are significantly more economical than receptacles made of high-purity quartz. This also avoids the problem of unreliable coating of a protective layer in angular or sharply tapered areas where the protective layer can be damaged particularly easily.

The protective layer for the protective film, which has a thickness of, for example, 1 mm, is preferably made of perfluoroalkoxy polymers (PFA).

Plastic guide elements for the substrates are advantageously fused onto the protective layer on oppositely disposed inner surfaces of the coated receptacle walls. This is considerably more cost-effective than quartz receptacles that are equipped with appropriate guide elements. Furthermore, a particle producing friction of the substrates of the relatively rough quartz is avoided. It is now possible to also use a metal, such as stainless steel or aluminum, as the base material for the receptacle.

Pursuant to one advantageous specific embodiment of the invention, the guide members comprise plastic strips that are glued or fused onto the inner walls of the fluid receptacle, respectively being disposed opposite one another.

The plastic strips preferably have a thickness that corresponds to the height of the guide members.

Pursuant to a further specific embodiment of the invention, the plastic strands have a diameter of, for example, 4 mm. They are fused with the protective layer and with one another in order to form appropriate guide members. The shape of the guide members is then achieved by rounding off or smoothing the edges of the strands.

If guide slots for the substrates are not formed by guide members that are appropriately spaced from one another, it is particularly advantageous to form guide slots for the substrates in appropriately wide plastic strips or plastic strips formed from plastic strands. The spacings between the guide slots, which are equidistant relative to one another, are selected in conformity with the packing thickness of the substrate packings provided for the fluid processing.

The guide members for the substrates, in other words the fused-on plastic strips or strands, are advantageously comprised of the same material as is the protective layer. This is advantageously PFA.

It is very advantageous to configure the guide slots in a V-shape in the introduction and withdrawal region for the substrates so that the introduced substrates are centered toward the actual guide and support region and in the entry area do not hit against the guide members. The V-shaped introduction and removal areas for the substrates furthermore have the advantage that in this way the rinsing and flow through with the processing fluid, for example with a rinsing agent, is improved.

As a consequence of inventively providing a protective layer on the receptacle walls that come into contact with the processing fluid, and fusing guide and support elements on this protective layer, it is now also possible to use metal, preferably stainless steel or aluminum, as the base material for the receptacle walls or for the entire receptacle. This results not only in considerably lower manufacturing costs but also a longer service life, because conventional receptacles are made of quartz and the service life of quartz in conjunction with the processing fluid that is used, for example, for semiconductor wafers, is limited.

Pursuant to a further specific embodiment of the invention, the receptacle is made of quartz despite the presence of a protective layer and the inventive possibility of fusing guide and support elements for the substrates onto the protective layer. This is particularly advantageous when a reliable and smooth-running substrate processing must be ensured even if the protective layer is damaged for some reason, so that in the event of steel or aluminum receptacles the processing fluid could be contaminated. This danger does not exist with quartz receptacles, even when the protective layer is damaged. However, due to the presence of the protective layer the quartz receptacle has a significantly longer service life than do conventional apparatus.

Pursuant to a particularly advantageous specific embodiment of the present invention, the substrate support is a metal strip that according to the invention is coated with a protective layer and onto which, after the coating with a protective layer, is fused a blade-like plastic substrate support or receiving element. Since pursuant to the present invention a metal strip can also be used, since the blade-like plastic receiving element can be fused despite the fact that it is coated with a protective layer, the substrate support can be very narrow and thus allows optimum flow conditions. It is therefore no longer necessary to provide measures for improving the flow conditions about the substrate support, as this is described in the not previously published German Patent application 196 44 254.0.

Instead of fusing the blade-like plastic substrate receiving element onto the metallic substrate support that is coated with a protective layer, it is also possible pursuant to a further embodiment of the invention to place or slip the substrate receiving element onto the substrate support as a cap.

The blade-like substrate receiving elements are preferably provided with uniformly spaced notches for the substrates in order to be able to equidistantly space the substrates relative to one another on the substrate support.

Pursuant to a particularly advantageous specific embodiment of the substrate support, at least one stabilization element is provided that is disposed parallel to the substrate support and is connected thereto. In this way it is further possible to make the actual substrate support, on which the substrates are supported, even narrower and hence more aerodynamic, since now the stabilization element, or the stabilization elements disposed on both sides of the substrate support, ensure that the substrate support is rigid and does not vibrate.

To achieve good flow dynamics, the stabilization elements should also be as narrow as possible and in particular on their upper side, in others words in the area of separation of the flow, should be as pointed as possible in order to provide the smallest possible separation edges for the flow, thus keeping turbulence to a minimum. However, it is very difficult if not impossible to coat edges or sharply tapered edges, such as blade-like elements, with a protective layer such that especially at such edges the protective layer is not thick or does not even adhere. Forth is reason, pursuant to an advantageous specific embodiment of the invention, the stabilization elements, which are coated with a protective layer, do not have a blade-like configuration on their upper surface, but rather are provided with a blade-like element that is fused or placed upon the protective layer of the stabilization elements.

BRIEF DESCRIPTION OF THE DRAWINGS

The invention will subsequently be described in detail with the aid of preferred specific embodiments. Shown are:

FIG. 2 an enlarged detail of the embodiment illustrated in FIG. 1 to describe the guide members, FIGS. 3a, 3b and 3c enlarged cross-sectional views of the guide members to show their manufacture from plastic strands, FIGS. 4a 4b and 4c side views of the cross-sections illustrated in FIGS. 3a, 3b and 3c, FIG. 5 an enlarged guide member viewed in the direction toward the guide slot, FIG. 6 an enlarged cross-sectional view of the substrate support region, and FIG. 7 a side view of the substrate support illustrated in cross-section in FIG. 6.

DESCRIPTION OF PREFERRED EMBODIMENTS

Figure 1:
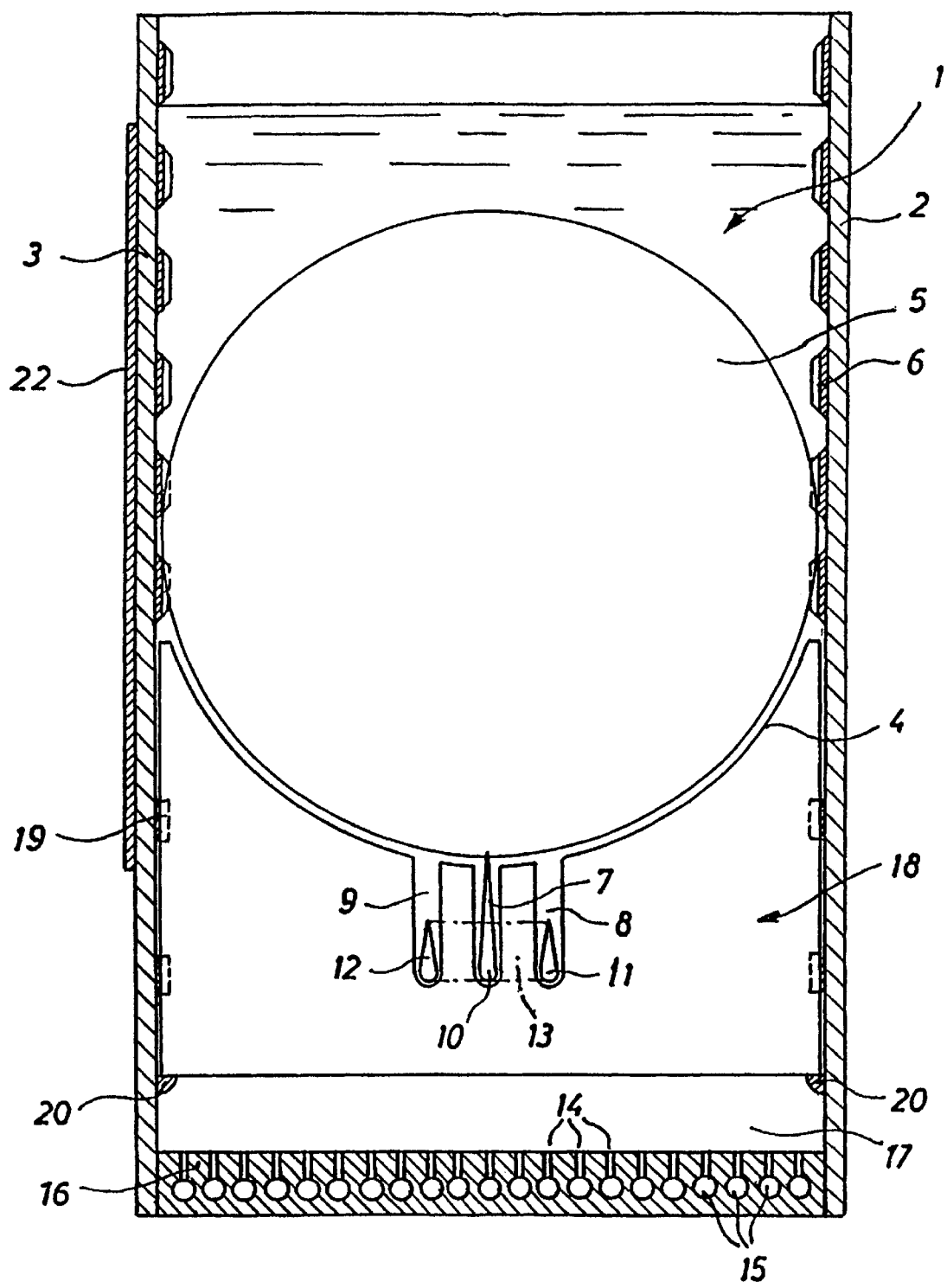
FIG. 1 a schematic cross-sectional view through one inventive apparatus.

The fluid container or receptacle illustrated in FIG. 1 has side walls 2, 3 as well as a container or receptacle bottom 4, which is adapted to the round shape of the substrates 5 that are to be processed.

Disposed one above the other on the inner surface of the receptacle walls 2, 3 are guide members 6 for the substrates 5; the substrates are guided in the guide members during insertion and removal, and are held therein during the fluid processing.

Respective slots 7,8,9 for a substrate support 10 and stabilization elements 11, 12 are provided in the receptacle bottom 4; the substrate support 10 and the stabilization elements 11, 12 can be lowered into the slot.

The stabilization elements 11, 12 are connected to the substrate support 10 by crosspieces 13 that provide additional mechanical support, so that the substrate support 10 is rigid and does not vibrate during raising and lowering procedures.

Disposed on the bottom of the fluid receptacle are fluid inlet nozzles 14 that in a nozzle plate 16 are connected with fluid channels 15 and allow the processing fluid to flow into a fluid area 17 for calming the flow conditions. The processing fluid thereafter flows between equidistantly spaced and parallel plates 18 that form spaces with flow slots through which the processing fluid exits from the receptacle bottom 4 into the interior of the receptacle. In the lower region of the receptacle walls 2, 3, namely in the region of the plate 18, guide and support elements 19 are provided for the plates, with these elements preferably having the same configuration as the guide members 6 for the substrates 5, although they may also have different configurations. In the illustrated embodiment, the individual plates are disposed on support members 20 that are disposed above the flow area 17.

Disposed on the outside of at least one side wall 3 of the receptacle 1 is an ultrasonic transducer 22 for subjecting the interior of the receptacle with ultra or mega sonic waves.

To avoid repetition with regard to further details of this apparatus and of the treatment process for the substrate 5, reference is made to DE 44 14 077, DE 195 46 990 and DE 196 44 253.2, which are incorporated by reference into the present application.

FIG. 2 shows an enlarged detail of the schematic cross-sectional illustration of an inventive embodiment according to FIG. 1. The side wall 2 is made, for example, of a metal, such as stainless steal, aluminum or the like. Disposed on the inner surface of the side wall that is exposed to the processing fluid is a protective layer 24, for example a PFA layer or a PFA film having, for example, a thickness of 1 mm. Welded onto the protective layer 24 are guide and support members 6 for the substrates 5. The support and guide members 6 are preferably made of plastic, and in particular of the same material as is the protective layer 24, i.e., in the present situation PFA. The guide and support members 6 are provided with guide slots 25 in which the substrates 5 are guided during insertion and removal and are held during the processing.

Although continuous slots are also possible, it is advantageous for two reasons to provide guide and support members 6 that are disposed perpendicular to one another and are spaced from one another. Individual guide and support members 6 allow for small contact areas with the substrates 5, and improve the flow and rinsing of the short guide slots 25 that result.

Pursuant to a further advantageous specific embodiment of the invention, the substrates 5 are advantageously held in their processing position by two guide and support members and not only by introduction and support members 6. As a result, it is again possible to minimize the contact area of the substrate 5 with the guide members 6.

Especially when the receptacle wall 2 is made of metal, it must be ensured that the substrates 5 cannot contact the protective layer 6 during raising and lowering movements in order to avoid any damage to the protective layer 24. Therefore, the minimum spacing between the substrate 5 and the side wall 2, i.e., the protective layer 24, should be 1 mm.

One specific embodiment of the present invention will be described subsequently with the aid of FIGS. 3 and 4, pursuant to which the guide and support members 6 are formed on the protective layer 24. In a first layer 31, PFA cords or strands 32 are fused to one another and also onto the protective layer 24. In an appropriate gradation, in a second layer 33, further stands 32 are fused onto the first layer 31. To achieve an essentially trapezoidal shape of the guide and support members 6, the sides of the fused-on PFA strands 32 are beveled and smoothed, as shown in FIGS. 3a and 3b.

FIG. 3c and FIG. 4c show the guide and support members 6 after equidistantly spaced guide slots 5 have been cut or milled out.

As an alternative to the previously described configuration of the guide and support members 6, it is also possible to fuse PFA strips vertically or horizontally onto the protective layer 24.

As shown in FIG. 5, the top and bottom of the guide slots 25 in the guide and support members 6 widen in a V-shape, so that the substrates 5 that are introduced into the slots are centered and guided, whereupon they are subsequently safely and reliably guided and supported in the narrower area that is adapted to the thickness of the substrates 5.

Figure 6:
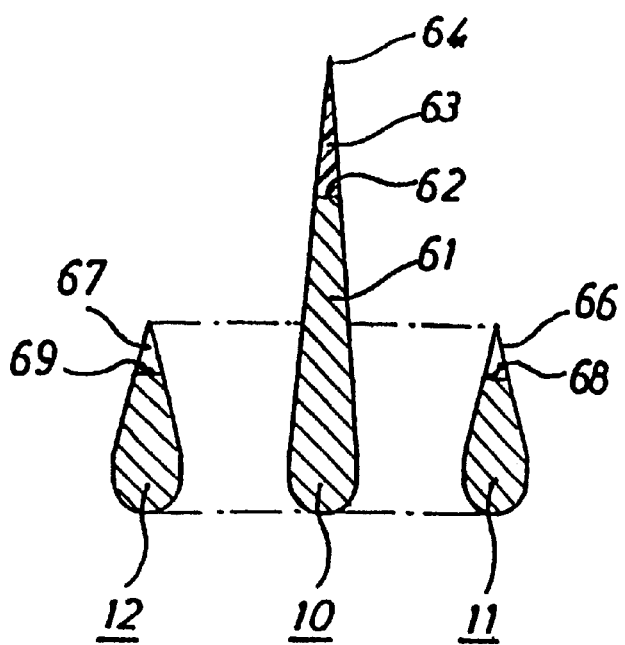
Figure 7:
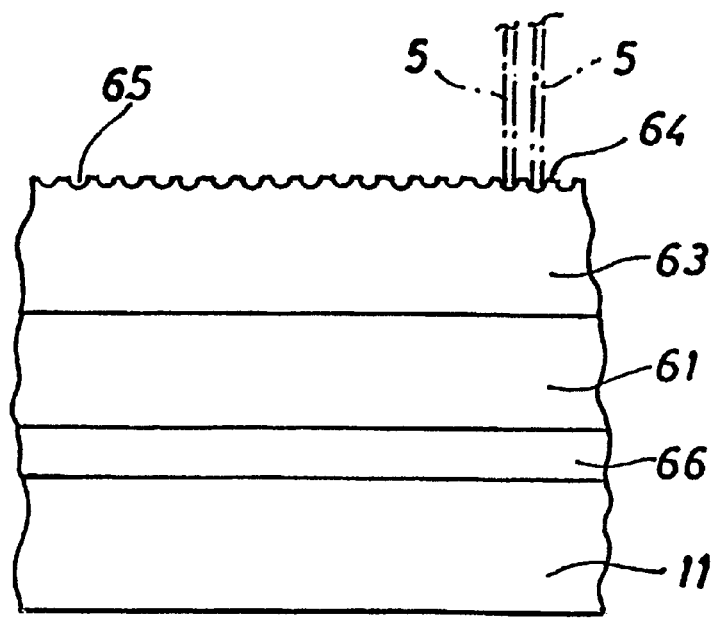

FIG. 6 shows an enlarged cross-section of the substrate support 10 already shown in FIG. 1, while FIG. 7 shows a side view. The substrate support 10 comprises a metal strip 61 that is provided with a protective coating. A blade-like substrate receiving element 63 is welded onto an upwardly facing surface 62 of the strip 61 with its protective coating. As can be seen in particular from FIG. 7, a blade-like edge 64 of the substrate receiving element is provided with notches 65 in which the substrates 5 are held such that they are spaced equidistantly from one another.

Since the strip 61 can be made of any desired material, for example from a very stable and rigid stainless steel, it is possible to make the strips 61 very narrow and adapt them to the optimum flow conditions for the processing fluid. In particular, the substrate support 10 can thereby be made very narrow, representing only a slight resistance for the processing fluid, which flows from the bottom toward the top.

A respective stabilization element 11, 12 is disposed parallel to and on both sides of the substrate support 10, and at equal distances therefrom; the stabilization elements can be made of any desired material and are similarly provided with a protective coating. By means of non-illustrated transverse connections, these stabilization elements 11, 12 are connected to the substrate support 10 and increase the rigidity thereof.

The upper regions of the stabilization elements 11, 12 each comprise a plastic blade-like element 66, 67 that is preferably made of the same material as the protective coating. These elements are fused onto the upper surfaces 68, 69 on the protective coating. The blade-like sharp edge, as is the case with the substrate support 10, represents a small separation edge, as a result of which the flow conditions in the fluid receptacle 1 are disrupted only slightly, if at all. The fusing of the plastic blade like element 66, 67 for the blade edge is necessary because coating such edges is not reliable and/or does not endure.

The present invention was described with the aid of preferred embodiments. One skilled in the art will recognize numerous embodiments and modifications without thereby deviating from the basic concept of the invention. In the illustrated embodiments, the inventive features have been described only in conjunction with elements of the container wall 2,3 and with the substrate supports 10 in the form of substrate receiving elements 63. However, the inventive principles are also applicable in conjunction with other components and elements that are exposed to the processing fluid, for example for the guide and support elements, as they are described in DE 195 46 990.

The specification incorporates by reference the disclosure of German priority document 196 48 498.7 of Nov. 22, 1996 and PCT/EP97/05409 of Oct. 1, 1997.

The present invention is, of course, in no way restricted to the specific disclosure of the specification and drawings, but also encompasses any modifications within the scope of the appended claims.

What is claimed is:

1. An apparatus for processing substrates, comprising:
    a receptacle for containing processing fluid;
    a protective layer provided on components of said receptacle that come into contact with processing fluid;
    guide members for substrates, wherein said guide members comprise polymeric strands that are fused with said protective layer and with one another; and
    at least one substrate support disposed in said receptacle.

2. An apparatus according to claim 1, wherein said protective layer is made of perfluoroalkoxy polymers (PFA).

3. An apparatus according to claim 1, wherein said polymeric guide members for said substrates are fused onto said protective layer of oppositely facing coated walls of said receptacle.

4. An apparatus according to claim 3, wherein said receptacle walls that are coated with said protective layer are made of metal, especially stainless steel or aluminum.

5. An apparatus according to claim 3, wherein said receptacle walls that are coated with said protective layer are made of quartz.

6. An apparatus according to claim 1, wherein said polymeric strands of said guide members are polymeric strips.

7. An apparatus according to claim 1, wherein said guide members are made of PFA.

8. An apparatus according to claim 1, wherein said guide elements are provided with guide slots for said substrates.

9. An apparatus according to claim 8, wherein said guide slots have V-shaped introduction and discharge areas for said substrates.

10. An apparatus for processing substrates, comprising:
    a receptacle for containing processing fluid;
    at least one substrate support disposed in said receptacle;
    a strip that is coated with a protective layer and is provided for components of said at least one substrate support that come into contact with processing fluid; and
    a blade-like polymeric substrate receiving element that is fused onto said strip.

11. An apparatus according to claim 10, wherein said substrate receiving element is provided with a blade-like edge that in turn is provided with uniformly spaced notches.

12. An apparatus according to claim 10, which includes at least one stabilization element that is disposed parallel to and is connected to said at least one substrate support.

13. An apparatus according to claim 12, which includes a respective stabilization element on each side of said at least one substrate support.

14. An apparatus according to claim 12, wherein said at least one stabilization element is made of a metal that is provided with a protective layer, and wherein a blade-like element is fused or disposed on said protective layer.

15. An apparatus for processing substrates, comprising:

a receptacle for containing processing fluid;

at least one substrate support disposed in said receptacle;

a strip that is coated with a protective layer and is provided for components of said at least one substrate support that come into contact with processing fluid; and a blade-like polymeric substrate receiving element that is disposed on or over said strip as a cap.

16. An apparatus according to claim 15, wherein said substrate receiving element is provided with a blade-like edge that in turn is provided with uniformly spaced notches.

17. An apparatus according to claim 15, which includes at least one stabilization element that is disposed parallel to and is connected to said at least one substrate support.

18. An apparatus according to claim 17, which includes a respective stabilization element on each side of said at least one substrate support.

19. An apparatus according to claim 17, wherein said at least one stabilization element is made of a metal that is provided with a protective layer, and wherein a blade-like element is fused or disposed on said protective layer.

* * * * *

UNITED STATES PATENT AND TRADEMARK OFFICE
CERTIFICATE OF CORRECTION

PATENT NO. : 6,189,552 B1
DATED : February 20, 2001
INVENTOR(S) : John Oshinowo

It is certified that error appears in the above-identified patent and that said Letters Patent is hereby corrected as shown below:

Title page,
Item [54] should read as follows:

[54] Title: APPARATUS FOR PROCESSING SUBSTRATES

Signed and Sealed this

Second Day of October, 2001

Attest:

*Nicholas P. Godici*

NICHOLAS P. GODICI
*Attesting Officer*    *Acting Director of the United States Patent and Trademark Office*